United States Patent
McLaury

[19]
[11] Patent Number: 5,926,433
[45] Date of Patent: *Jul. 20, 1999

[54] DUAL STROBED NEGATIVE PUMPED WORLDLINES FOR DYNAMIC RANDOM ACCESS MEMORIES

[75] Inventor: Loren L. McLaury, Boise, Id.

[73] Assignee: Micron Technology, Inc., Boise, Id.

[*] Notice: This patent is subject to a terminal disclaimer.

[21] Appl. No.: 08/806,703

[22] Filed: Jan. 29, 1997

Related U.S. Application Data

[63] Continuation of application No. 08/489,099, Jun. 9, 1995., Pat. No. 5,650,976, which is a continuation-in-part of application No. 08/374,273, Jan. 18, 1995., abandoned, which is a division of application No. 08/062,649, May 14, 1993., Pat. No. 5,410,508

[51] Int. Cl.$^6$ .................................................. G11C 13/00
[52] U.S. Cl. ............................ 365/230.06; 365/189.09; 365/226
[58] Field of Search ................... 365/230.06, 189.09, 365/193, 226

[56] References Cited

U.S. PATENT DOCUMENTS

| | | | |
|---|---|---|---|
| 4,543,500 | 9/1985 | McAlexander, III et al. | 307/530 |
| 4,897,568 | 1/1990 | Chern et al. | 307/530 |
| 4,897,820 | 1/1990 | Shiomi et al. | 365/230.08 |
| 5,051,959 | 9/1991 | Nakano et al. | 365/230.06 |
| 5,132,575 | 7/1992 | Chern | 307/530 |
| 5,175,450 | 12/1992 | Chern | 307/530 |
| 5,206,551 | 4/1993 | Chern | 307/530 |
| 5,245,578 | 9/1993 | McLaury | 365/203 |
| 5,257,238 | 10/1993 | Lee et al. | 365/230.06 |
| 5,260,646 | 11/1993 | Ong | 365/189.09 X |
| 5,267,201 | 11/1993 | Fioss et al. | 365/189.09 |
| 5,283,761 | 2/1994 | Gillingham | 365/189.09 |
| 5,297,104 | 3/1994 | Nakashima | 365/230.06 |
| 5,302,870 | 4/1994 | Chern | 307/530 |
| 5,311,481 | 5/1994 | Casper et al. | 365/230.06 |
| 5,324,998 | 6/1994 | Powell | 365/185.17 |
| 5,351,217 | 9/1994 | Jeon | 365/230.06 |
| 5,410,508 | 4/1995 | McLaury | 365/230.06 X |
| 5,416,747 | 5/1995 | Ohira | 365/230.06 |
| 5,650,976 | 7/1997 | McLaury | 365/230.06 |

*Primary Examiner*—Do Hyun Yoo
*Attorney, Agent, or Firm*—Schwegman, Lundberg, Woessner & Kluth, P.A.

[57] ABSTRACT

The invention is a circuit and a method for resetting a wordline by driving a potential of the wordline toward a ground reference potential prior to driving the potential of the wordline to a negative potential.

18 Claims, 4 Drawing Sheets

DUAL STROBED NEGATIVE PUMPED WORLDLINES FOR DYNAMIC RANDOM ACCESS MEMORIES

This is a continuation of Loren McLaury's U.S. patent application having Ser. No. 08/489,099, filed on Jun. 9, 1995, now U.S. Pat. No. 5,650,976, and entitled "DUAL STROBED NEGATIVE PUMPED WORDLINES FOR DYNAMIC RANDOM ACCESS MEMORIES" which is a continuation-in-part of an application of Loren McLaury's having Ser. No. 08/374,273 filed on Jan. 18, 1995, now abandoned, and entitled "A MEMORY CHIP HAVING TRANSISTORS IN ARRAY AND PERIPHERY CIRCUITRY WHICH PROVIDE HIGH SPEED IN THE PERIPHERY AND MINIMAL LEAKAGE IN THE ARRAY", which is a divisional of Loren McLaury's patent U.S. Ser. No. 08/062,649 filed May 14, 1993 entitled "PUMPED WORDLINES" and having U.S. Pat. No. 5,410,508.

FIELD OF THE INVENTION

The present invention relates to dynamic random access memories, and more particularly, to a circuit and a method for driving a potential of an inactive wordline to a negative potential.

SUMMARY

The invention is a method and a circuit which efficiently drives a potential of an inactive wordline to a negative potential. When the wordline is deactivated during reset its potential is first driven toward a reference potential in response to a first control signal and is then driven toward a negative potential in response to a second control signal.

In one embodiment the wordline is first coupled to a variable potential node held at a ground reference potential and then is further coupled to a supply node held at a negative potential (for example Vbb). Thus the potential of the wordline is driven toward the ground reference potential and then toward the negative potential. The wordline is simultaneously decoupled from the variable potential node and coupled to the supply node.

DETAILED DESCRIPTION OF THE INVENTION

The following patents of Loren McLaury's are incorporated by reference: U.S. Pat. No. 5,410,508, entitled PUMPED WORDLINES and filed on May 14, 1993, and U.S. Pat. No. 5,245,578 entitled A DRAM WITH A TWO STAGE VOLTAGE PULL-DOWN SENSE AMPLIFIER and filed on Aug. 12, 1992.

Figure 1:
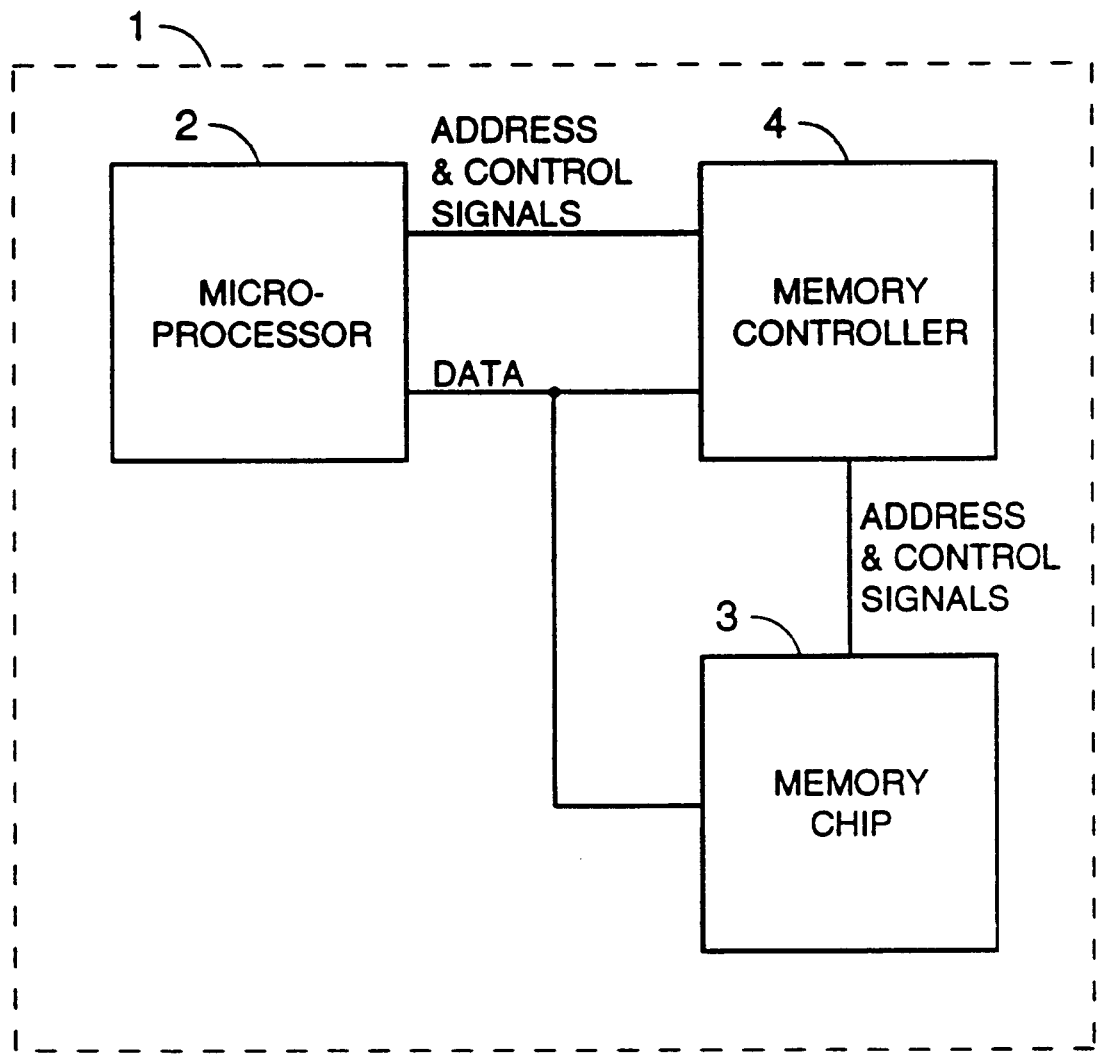
FIG. 1 is a block schematic of a computer system of the invention.

The invention is a computer system 1, as shown in FIG. 1, which stores memory data. The computer system 1 has a microprocessor 2 which receives an address and a read or write command. The microprocessor 2 routes the address and command to a memory chip 3 via a memory controller 4 and routes data to and from the memory chip 3. The memory chip 3 may be a dynamic random access memory device. In any case the memory chip 3 comprises the circuit and the method of the invention which drives a potential of a selected wordline to a select potential and which resets the select wordline by driving the potential of the wordline to a non-select potential. The non-select potential is driven to the wordline being reset by first driving the potential of the wordline toward a ground reference potential and by secondly driving the potential of the wordline toward a negative potential. During reset an active wordline is deactivated. Typically the circuit of the invention responds to a first control signal to couple the wordline to a first node driven toward the ground reference potential and responds to a second control signal to couple the wordline to a second node connected to the negative potential which is less than the ground reference potential or less than the lowest potential to which the digit lines are driven.

Figure 2:
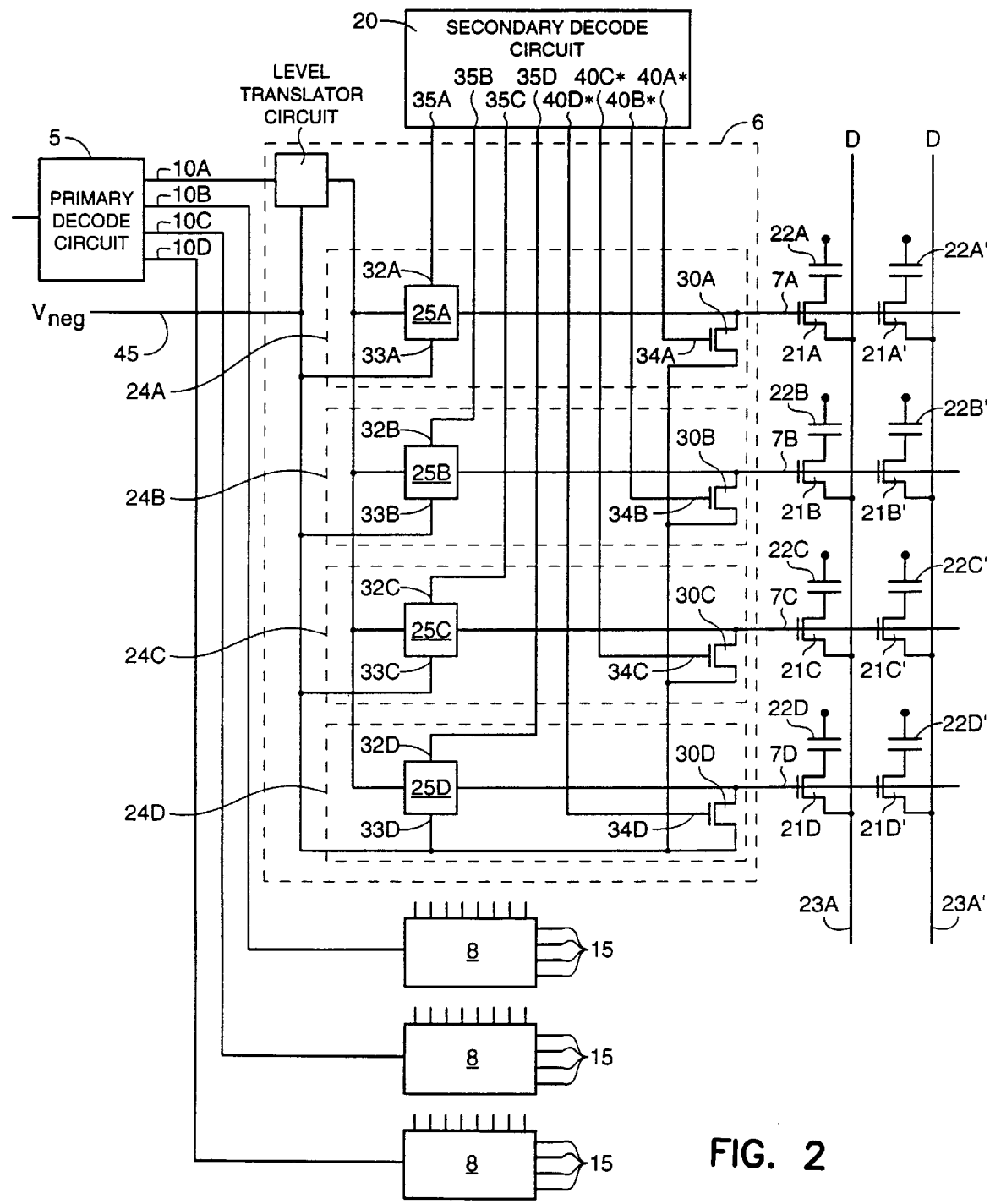
FIG. 2 is a block schematic of decode circuitry and driver circuitry of the invention.

FIG. 2, described below using a specific example, is a block schematic of a portion of the circuit of the invention. A primary decode circuit 5 determines a select group 6 of wordlines 7 with a first potential on its output node 10A and determines non-select groups 8 of wordlines 15 with a second potential on its output nodes 10B–D. (Although the number of wordlines in the select and non-select groups 6 and 8 is equal to four, in the example, it is possible for the number of wordlines in a group of wordlines to vary.) One of the wordlines in the select group 6 of wordlines 7 is then selected as the select wordline 7A by the secondary decode circuit 20. When wordline 7A is selected it is driven to a high potential which actuates the gates of access transistors 21A&A' which are N-channel enhancement or depletion type transistors. When actuated the access transistors 21A&A' couple the memory storage cells 22A&A' to the digit lines 23A&A', respectively. Memory storage cells 22B&B'–D&D' remain isolated from the digit lines 23A&A'.

For each wordline there is a driver circuit 24(A–D) which drives the select and non-select wordlines to appropriate potentials. Each driver circuit 24A–D is comprised, respectively, of a first driver circuit 25A–D and a second driver circuit 30A–D. Potentials of first nodes 32A–D of first driver circuits 25A–D are driven toward first supply potentials, and second nodes 33A–D of first driver circuits 25A–D are connected to a supply node 45 which is connectable to a negative supply potential. The first supply potentials vary between a ground reference potential and a positive potential. Therefore the first nodes 32A–D can be thought of as variable potential nodes whose potentials are controlled by secondary decode circuit 20. The second driver circuits 30A–D are controlled by the secondary decode circuit at control inputs 34A–D, respectively. The second driver circuits 30A–D are interposed between the wordlines 7A–D and supply node 45.

The secondary decode circuit 20 has a first set of four output nodes 35A–D. Each one of the output nodes 35A–D is connected to a corresponding one of the first nodes 32A–D of the first driver circuits 25A–D. The secondary decode circuit 20 also has a second set of four output nodes 40A*–D*. Although the potentials of the second set of output nodes 40A*–D* are complements of the potentials on the first set of output nodes 35A–D, respectively, a transition to the complement on nodes 40A*–D* may be delayed from a corresponding transition on nodes 35A–D. Each one of the second set of output nodes 40A*–D* is connected to a corresponding one of the control inputs 34A–D, respectively, of the second driver circuits 30A–D.

In the example the primary decode circuit 5 determines that the selected wordline is one of wordlines 7A–D and that the non selected wordlines are 15. In the example, wordline 7A is selected to be activated by the secondary decode circuit 20. Therefore, secondary decode circuit 20 also determines that wordlines 7B–D are non-selected. The secondary decode circuit 20 supplies the positive potential at nodes 34B–D. The positive potential activates a transistor within the second driver circuits 30B–D. The non select wordlines 7B–D remain at a negative potential and are coupled to supply node 45 through the activated transistors.

Thus if one of the wordlines in a group of wordlines is addressed for activation, the group 6 of wordlines containing the addressed wordline is selected by the primary decode circuit 5 which generates a first potential at the appropriate output node, in this example output node 10A. Since the remaining groups 8 of wordlines 15 are not selected the primary decode circuit 5 generates a second potential at nodes 10B–D. The first potential at node 10A activates circuitry within the first driver circuits 25A–D to couple the wordlines 7A–D to the first nodes 32A–D, respectively. The secondary decode circuit 20 determines which potential is driven to the first nodes 32A–D. If the wordline is selected, in the example, 7A, the secondary decode circuit 20 provides the positive potential at the first node, 32A in the example. The potential of the wordline 7A is then driven toward the positive potential. However, if the wordline is not selected the secondary decode circuit 20 supplies the ground reference potential at the first nodes 34B–D, in the example. In this example, the complement of the ground reference potential, a high potential, is supplied by the secondary decode circuit 20 to output nodes 40B*–D* and thus control inputs 34B–D. The high potential on control inputs 34B–D actuates transistors of secondary driver circuits 30B–D, and the non-selected wordlines 7B–D are coupled to the supply node 45, and the potentials of the non-selected wordlines are driven toward the negative potential at supply node 45 through the transistor actuated within each driver circuit 30B–D, respectively. The potential at the control input 34A of secondary driver circuit 30A is low which deactivates the transistor of second driver 30A.

In the case of the non-selected groups 8 of wordlines the output potential on output nodes 10B–D couples the non-selected wordlines 15 to supply node 45 to maintain the negative potential existing on the non-selected wordlines.

During reset of the selected wordline to a non-select potential the secondary decode circuit 20 takes the potential of node 35A, and thus the potential of first node 32A, to the ground reference potential; nodes 35B–D are already at the ground reference potential. The first potential, which remains on the primary decode circuit's 5 output node 10A, causes the first driver circuit 25A to couple the wordline 7A to the ground reference potential at first node 32A. Following a time delay, the primary decode circuit 5 causes the potential at node 10A to switch logic states to the second potential, and the secondary decode circuit simultaneously supplies a positive potential to node 40A*. In response to the second potential now on 10A the first driver circuit 25A decouples the wordline 7A from node 32A and couples the wordline 7A to second node 33A, thereby driving the potential of wordline 7A toward the negative potential at supply node 45 and providing parallel coupling of wordlines 7B–D to the supply node 45. Of course the positive potential at node 34A activates the transistor of the second driver circuit 30A, thereby providing parallel coupling of wordline 7A to the negative potential at supply node 45. Now wordline 7A is reset.

Often a level translator 50 is interposed between each of the output nodes 10A–D of the primary decode circuit 5 and the first driver circuits 25A–D for each of the groups of wordlines 6 and 8. The level translator 50 in each of the groups of wordlines 6 and 8 drives the driver circuits 25A–D with potentials at appropriate levels. Level translators are well known to those in the art.

For clarification it should be noted that in a precharge or standby mode secondary decode circuit 20 supplies a high potential on all of the complementary output nodes (such as 40A*–D*). This high potential on the output nodes actuates all of the second driver circuits on the memory chip to ensure the deactivation of all of the wordlines by driving the potential of all of the wordlines negative. In addition all of first driver circuits of the memory chip couple the wordlines to the negative supply node 45 in precharge.

Figure 3:
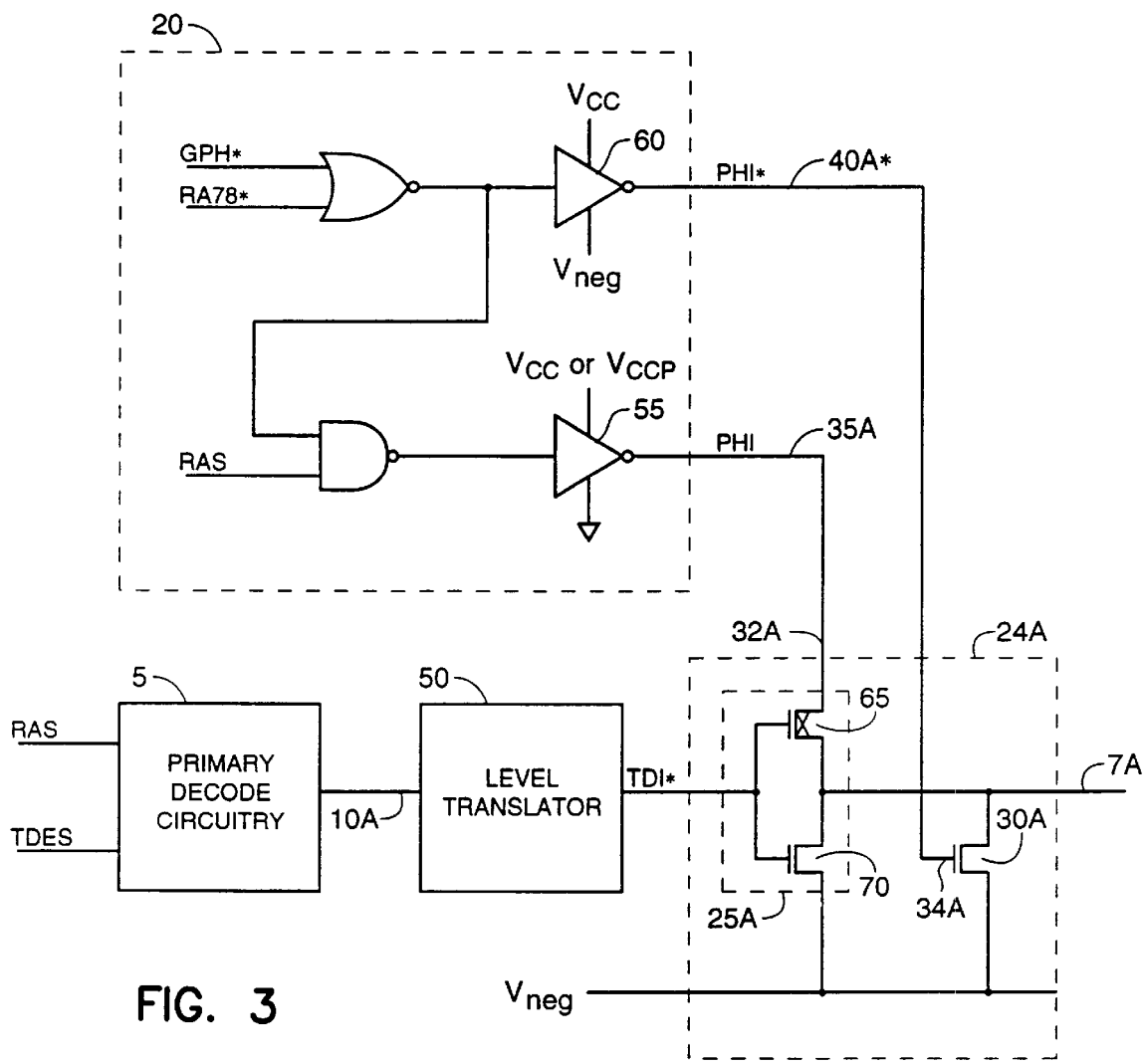
FIG. 3 is a more detailed schematic of the decode circuitry and the driver circuitry shown in FIG. 2.

Circuitry of a portion of the secondary decode circuit 20 and the first driver circuit 25 A is shown in FIG. 3. In order to better understand the circuitry and method of the invention the reader is encouraged to refer to and study the timing diagram shown in FIG. 4 as the circuitry and method are explained with respect to FIG. 3.

It can be seen that the secondary decode circuit 20 responds to a row address strobe (RAS) signal and an address signal RA78*, in addition to a gap phase signal which is generated internally in response to RAS and an enable row phase (ENROWPHASE) signal which is also generated internally in response to the RAS. It can also be seen that the signals PHI and PH1* are complementary signals at nodes 35A and 40A*, respectively, although there is a longer time delay from the PHI transitioning low to the PHI* transitioning high than exists when PHI* transitions low and PHI transitions high. In the later case the result is the elimination of crossing current. Efficiency increases with the elimination of crossing current. PHI swings between a positive VCC and a ground reference potential, and PHI* swings between Vcc or Vccp and a negative potential less than the ground reference potential, since these are the potentials supplied to inverters 55 and 60, respectively. Inverters 55 and 60 may include internal level translation circuitry, not shown in the Figures, but well known to those skilled in the art.

The level translator 50 responds to the potential on node 10A to generated a level translated signal TDI*, which controls the first driver circuit 25A. When TDI* is low it actuates PMOS transistor 65 and when it is high it actuates NMOS transistor 70. Typically, NMOS transistor 70 can be much smaller than the NMOS transistor in second driver circuit 30A. During selection of the wordline 7A, PHI is at a positive potential and the PMOS transistor 65 is actuated coupling the wordline 7A to first node 32A through PMOS transistor 65 to pull the potential of wordline 7A toward the positive potential of PHI. During reset PEH transitions to the ground reference potential in response to RAS; TDI* is still low; and wordline 7A is coupled to first node 32A through PMOS transistor 65 and the potential of the wordline is pulled toward the ground reference potential of PH. As the potential of the wordline approaches the ground reference potential the source to drain potential ideally decreases to a value at which transistor 65 ceases to conduct current. When TDI* transitions high in response to RAS* transitioning high and in response to a tree decode enable (TREEDECEN) signal transitioning low, the PMOS transistor 65 is deactuated and the NMOS transistor 70 actuates to couple the wordline 7A to supply node 45 through NMOS transistor 70. In addition PHI* goes high simultaneously actuating second driver circuit 30A thereby coupling the wordline 7A to supply node 45 through the actuated NMOS transistor of second driver circuit 30A. Thus the potential of wordline 7A is pulled from the value at point 115 shown on the timing diagram in FIG. 4 toward the negative potential on supply node 45. There is zero crossing current since PMOS transistor deactivates simultaneously to the activation of the NMOS transistor 70 and the NMOS transistor of second driver circuit 30A.

Figure 5:
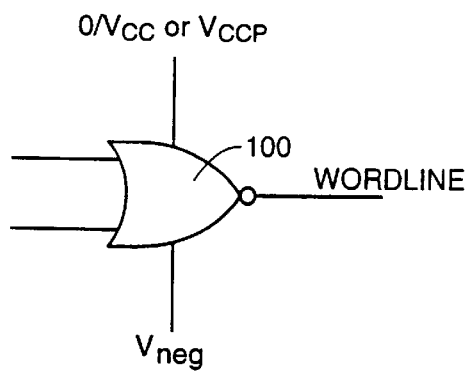
FIG. 5 is a simplification of the driver circuitry shown in FIG. 3.

FIG. 5 is a simplified logic circuit of the invention. Although the logic circuit has been shown as a NOR gate 100 it is obvious to those skilled in the art that a Negative AND gate would also work. In addition other logic gates can be used if the control signals differ from those used in this embodiment. Which ever logic circuit is used, one concept of the invention remains the same: A selected wordline at a first potential is reset to a second potential by first driving a potential of the wordline to a third potential having a value lying between values of the first and second potentials. In this embodiment the wordline is driven to the first and the third potentials in response to a first control signal and is driven to the second potential in response to a second control signal.

Figure 4:
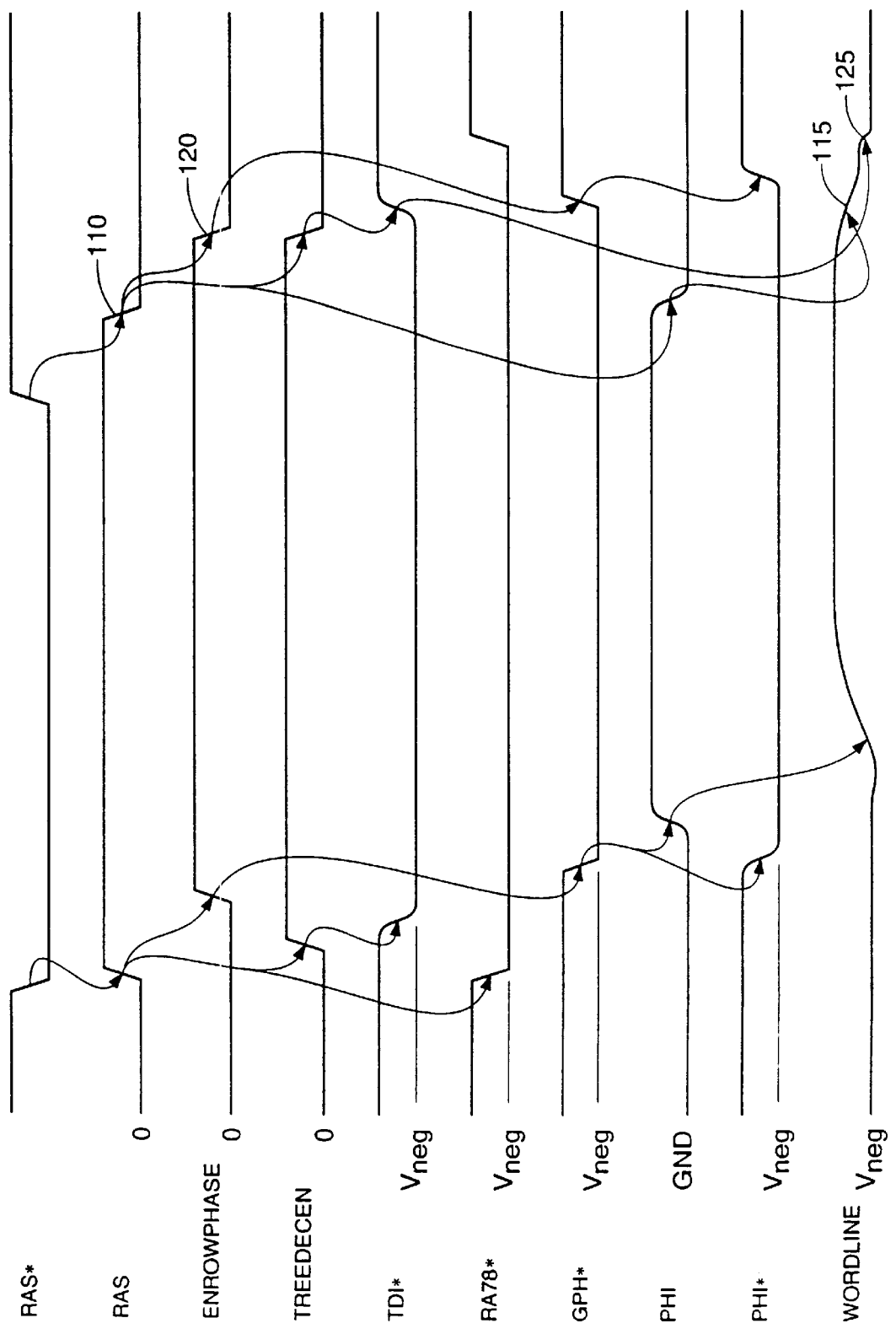
FIG. 4 is a timing diagram descriptive of a method of the invention when implemented with respect to the circuit of FIG. 3.

It can been seen by studying the timing diagram of FIG. 4 that when RAS* returns high RAS internal is delayed, see point 110 on the timing diagram, to allow sufficient time for a write back to occur. Thus a selected wordline can be reset after a time delay. The time delay is dependent on ENROWPHASE which is generated internally in response to RAS. ENROWPHASE controls a generation of interal signal GPH* which in turn controls the generation of PHI*. During reset the potential of the wordline is first coupled toward the ground reference potential, see point 115, in response to the PHI which is responsive to RAS. After a time delay, the potential of the wordline is further coupled toward Vneg, see point 125. Typically, the time delay is at least equal to the time required for the potential of the wordline to be driven to a value at which current ceases to flow in transistor 65 of FIG. 3. However even if the time delay is shorter and current still flows through transistor 65 transistor 65 is deactivated by TDI* when NMOS transistor 70 is activated by TDI*. Thus the circuit an method of the invention eliminate contention between the ground reference potential and Vneg.

It can be seen that the invention provides an efficient circuit and method for driving a potential of a wordline to a reset or a non select potential. Using the circuit and method of the invention it is no longer necessary to pump Vcc to a pumped potential although the invention does not preclude the use of a pumping circuit. By using depletion access devices in the array a complete write back of a "1" can be accomplished with the wordline at Vcc. The circuit of the invention is very efficient since there is no power loss due to crossing current when taking the potential of an activated wordline to a deactivated potential. In related art applications this crossing current typically involves a pumped supply potential (Vccp). It is well known that pumped supply potentials consume more power than non-pumped supply potentials. Thus power is conserved and efficiency is increased by using the present invention where a pumped potential is not required. There is also a possible better correlation of a Row Hammer Test Mode when the Vccp pump is not used. There is also minimal leakage from memory cells via the access devices in the circuit of the invention.

What is claimed is:
1. An apparatus, comprising:
a memory cell for storing data;
a wordline in electrical association with the memory cell;
a first transistor interposed between said wordline and a supply node;
a second transistor interposed between said wordline and a variable potential node, wherein a potential of the variable potential node varies between a first potential and a second potential, wherein when one of said first and said second transistors is actuated the remaining one of said first and said second transistors is deactuated; and
a third transistor interposed between said wordline and the supply node;
wherein a value of the second potential lies between a value of the first potential and a value of a supply potential connectable to the supply node, further wherein the second potential is a reference potential.
2. The apparatus as specified in claim 1, wherein said second transistor is actuated and said wordline is electrically coupled to the variable potential node to drive a potential of said wordline toward the first potential when said wordline is activated.
3. The apparatus as specified in claim 1, wherein said second transistor is actuated and said wordline is electrically coupled to the variable potential node to drive a potential of said wordline toward the second potential during deactivation of said wordline.
4. The apparatus as specified in claim 1, wherein said first transistor is actuated during deactivation of said wordline to electrically couple said wordline to the supply node and to drive a potential of said wordline toward a supply potential connectable to the supply node.
5. The apparatus as specified in claim 1, further comprising a decode circuit for supplying the potential of the variable potential node.
6. The apparatus as specified in claim 1, further comprising a decode circuit for generating a control signal to control an actuaton and deactuation of said third transistor.
7. The apparatus as specified in claim 6, wherein when said wordline is non-selected the decode circuit maintains an activation of the third transistor to maintain the wordline at the third potential.
8. The apparatus as specified in claim 1, wherein the third transistor is controlled by a signal complementary to the potential of the variable potential node.
9. The apparatus as specified in claim 1, wherein the wordline is inactive when the third transistor is actuated.
10. The apparatus as specified in claim 1, wherein when the third transistor is actuated the wordline is electrically coupled to the supply node and a potential of the wordline is driven toward the supply potential connectable to the supply node.
11. The apparatus as specified in claim 1, further comprising a control node, control inputs of said first and said second transistors connected at said control node.
12. The apparatus as specified in claim 11, further comprising a decode circuit for providing a decode signal at said control node to control an actuation and deactuation of said first and said second transistors.
13. A memory circuit, comprising:
a memory cell for storing data;
a wordline in electrical association with the memory cell;
driver circuit connected at an output to said wordline;
a decode circuit in electrical communication with the driver circuit, said decode circuit supplying a first potential and a second potential at a variable potential node of the driver circuit, wherein said wordline is electrically coupled to said variable potential node and a potential of said wordline is driven toward said first potential when said wordline is activated and the potential of said wordline is driven toward said second potential during a deactivation of said wordline; and wherein the driver circuit comprises a non-select driver circuit which responds to a complement of the first potential and the second potential at the variable potential node, wherein when said wordline is non-selected the complement maintains an activation of the non-select driver circuit to maintain the wordline at a third potential;

wherein a value of the second potential lies within a range of potentials lying between values of the first and the third potentials, further wherein the second potential is a reference potential.

14. The memory circuit as specified in claim 13, further comprising a further decode circuit in electrical communication with the driver circuit, said driver circuit responding to an output signal of said further decode circuit to electrically couple said wordline to the variable potential node.

15. The memory circuit as specified in claim 14, wherein said driver circuit further comprises a supply node connectable to the third potential, and wherein said driver circuit responds to the output signal of said further decode circuit to electrically decouple said wordline from the variable potential node and responds to the output signal of said further decode circuit to electrically couple said wordline to the supply node during the deactivation of said wordline.

16. A method for resetting a wordline from a first potential to a second potential, comprising:

generating a first internal signal in response to an external signal;

driving a potential of the wordline to a third potential from the first potential in response to the first internal signal, wherein a value of the third potential lies within a range of potentials lying between the first and the second potentials, wherein the third potential is a reference potential;

generating a second internal signal in response to the external signal; and driving the potential of the wordline to the second potential in response to the second internal signal.

17. A method for activating and deactivating a wordline, comprising:

supplying a first potential to a first supply node of a logic circuit in electrical communication with the wordline at an output node;

supplying a second potential to a second supply node of the logic circuit;

driving a potential of the wordline toward the first potential in order to activate the wordline;

supplying a third potential at the first supply node, wherein a value of the third potential lies between a value of the first and the second potentials, wherein the third potential is a reference potential;

driving the potential of the wordline toward the third potential at an initial deactivation of the wordline; and driving the potential of the wordline toward the second potential to deactivate the wordline.

18. A method for activating and deactivating a wordline, comprising:

supplying a first potential to a first node;

electrically coupling the wordline to the first node;

driving a potential of the wordline toward the first potential when activating the wordline;

supplying a second potential to the first node;

driving the potential of the wordline toward the second potential;

supplying a third potential to a second node, wherein a value of the second potential lies between a value of the first and the third potentials, wherein the second potential is a reference potential;

electrically decoupling the wordline from the first node;

electrically coupling the wordline to the second node; and driving the potential of the wordline toward the third potential to deactivate the wordline.

* * * * *